United States Patent
Jung et al.

(10) Patent No.: US 10,452,121 B2
(45) Date of Patent: Oct. 22, 2019

(54) METHOD FOR DETECTING TOUCH INPUT AND TOUCH INPUT DEVICE THEREFOR

(71) Applicants: Alps Electric Korea Co., Ltd., Gwangju (KR); Hyundai Motor Company, Seoul (KR); Kia Motors Corporation, Seoul (KR); Hyundai Mobis Co., Ltd., Seoul (KR)

(72) Inventors: Byung Eon Jung, Gwangju (KR); Sang Kyu Lee, Gwangju (KR); Seong Hwan Cho, Gyeonggi-do (KR); Sang Min Lee, Gyeonggi-do (KR); Yong Hee Han, Gyenggi-do (KR); Da Ye Oh, Gyeonggi-do (KR)

(73) Assignees: Alps Electric Korea Co., Ltd., Gwangju (KR); Hyundai Motor Company, Seoul (KR); Kia Motors Corporation, Seoul (KR); Hyundai Mobis Co., Ltd., Seoul (KR)

( * ) Notice: Subject to any disclaimer, the term of this patent is extended or adjusted under 35 U.S.C. 154(b) by 21 days.

(21) Appl. No.: 15/975,981

(22) Filed: May 10, 2018

(65) Prior Publication Data
US 2018/0329475 A1  Nov. 15, 2018

(30) Foreign Application Priority Data
May 11, 2017 (KR) .......... 10-2017-0058633

(51) Int. Cl.
*G06F 3/041* (2006.01)
*G06F 1/3234* (2019.01)
(Continued)

(52) U.S. Cl.
CPC .......... *G06F 1/3262* (2013.01); *G06F 1/3215* (2013.01); *G06F 1/3231* (2013.01);
(Continued)

(58) Field of Classification Search
CPC ................ H03K 17/955; H03K 17/962; G02F 1/13338; G06F 2200/1634;
(Continued)

(56) References Cited

U.S. PATENT DOCUMENTS

2016/0110013 A1* 4/2016 Yu .......................... G06F 3/0416
                                                                345/173
2017/0147131 A1* 5/2017 Rhee ................... G06F 3/04186
2017/0277336 A1* 9/2017 Yang ..................... G06F 3/0416

FOREIGN PATENT DOCUMENTS

JP  2016-139234 A  8/2016
KR  10-1143276 B1  5/2012
(Continued)

*Primary Examiner* — Sanghyuk Park
(74) *Attorney, Agent, or Firm* — Mintz Levin Cohn Ferris Glovsky and Popeo, P.C.; Peter F. Corless

(57) ABSTRACT

A method for detecting a touch input can include: scanning at least one function touch button of the touch input device and at least one comparison touch button of the touch input device; determining whether an expected touch input corresponds to an intention of a user or to a first environmental change causing the change in capacitance generated by the at least one function touch button; comparing the change in capacitance generated by the at least one function touch button with the change in capacitance generated by the at least one comparison touch button; and determining whether the expected touch input is a determined touch input corresponding to the intention of the user or a touch input corresponding to a second environmental change based on the comparison.

19 Claims, 7 Drawing Sheets

(51) Int. Cl.
*G06F 1/3231* (2019.01)
*G06F 1/3215* (2019.01)
*H03K 17/96* (2006.01)
*G06F 3/044* (2006.01)

(52) U.S. Cl.
CPC .......... *G06F 3/0416* (2013.01); *G06F 3/0418* (2013.01); *H03K 17/962* (2013.01); *G06F 3/044* (2013.01); *H03K 2217/94026* (2013.01); *H03K 2217/960705* (2013.01)

(58) Field of Classification Search
CPC ... G06F 2200/0339; G06F 2200/04103; G06F 2200/04104; G06F 3/03547; G06F 3/041–0416; G06F 3/0488–04886; G06F 1/169–1692; G06F 1/1643
See application file for complete search history.

(56) References Cited

FOREIGN PATENT DOCUMENTS

| | | |
|---|---|---|
| KR | 10-2013-0224191 | 11/2013 |
| KR | 10-2015-0077203 | 7/2015 |
| KR | 10-2016-0026199 | 3/2016 |
| KR | 10-2013-0124191 A | 11/2018 |

* cited by examiner

METHOD FOR DETECTING TOUCH INPUT AND TOUCH INPUT DEVICE THEREFOR

CROSS-REFERENCE TO RELATED APPLICATION

This application is based on and claims the benefit of priority to Korean Patent Application No. 10-2017-0058633, filed on May 11, 2017 in the Korean Intellectual Property Office, the disclosure of which is incorporated herein in its entirety by reference.

TECHNICAL FIELD

The present disclosure relates to a method for detecting a touch input and a touch input device therefor, and more particularly, relates to a method for detecting a touch input when a power-saving function is maintained for a long time and a touch input device therefor.

BACKGROUND

Recently, with the development of touch input technologies, a touch input device often includes touch buttons for user input in order to control electronic devices (i.e., control devices). For example, a touch input device for a vehicle may be implemented in a smart key and have a function touch button, such as a smart key button for door opening and closing control.

Such a touch input device may have a touch electrode configured to perform a wake-up function and may also have a microcontroller unit (MCU) for detecting a capacitance formed by the touch electrode. In this case, when a capacitance increases to a reference value or more, the function touch button may recognize a touch input of a user.

However, a conventional touch input device for a vehicle can mostly remain in a power-saving mode due to a limited battery lifetime. Although a user can operate an electronic device (i.e., control device) for a vehicle in various environments, since the electronic device is usually maintained in the power-saving mode, the conventional input device for vehicle may not detect a change in capacitance detected by a function touch button.

In addition, when capacitances generated by a function touch button are sharply increased or decreased by external environmental changes such as humidity and temperature, the conventional touch input device for a vehicle recognizes the increase or decrease as a touch input as soon as it wakes up, even though there is no user touch input. Meanwhile, the conventional touch input device can fail to recognize a user touch input when it occurs.

SUMMARY

The present disclosure has been made to solve the above-mentioned problems occurring in the related art while advantages achieved by the related art are maintained intact.

An aspect of the present disclosure provides an apparatus for detecting a touch input to distinguish whether a touch input corresponds to a change in capacitance by a touch input of a user or a change in capacitance by various environmental changes, as well as a touch input device therefor.

Another aspect of the present disclosure provides a method for detecting a touch input to cause a wake-up operation by a change in capacitance, as well as a touch input device designed to cause the wake-up operation by the change in capacitance.

The technical problems to be solved by the present inventive concept are not limited to the aforementioned problems, and any other technical problems not mentioned herein will be clearly understood from the following description by those skilled in the art to which the present disclosure pertains.

According to embodiments of the present disclosure, a method for detecting a touch input may include: after a wake-up of the touch input device, scanning at least one function touch button of the touch input device and at least one comparison touch button of the touch input device; detecting a change in capacitance generated by the at least one function touch button and a change in capacitance generated by the at least one comparison touch button as a result of the scanning of the at least one function touch button and the at least one comparison touch button; determining whether an expected touch input corresponds to an intention of a user or to a first environmental change causing the change in capacitance generated by the at least one function touch button; comparing the change in capacitance generated by the at least one function touch button with the change in capacitance generated by the at least one comparison touch button; and determining whether the expected touch input is a determined touch input corresponding to the intention of the user or a touch input corresponding to a second environmental change based on the comparison of the change in capacitance generated by the at least one function touch button with the change in capacitance generated by the at least one comparison touch button.

The wake-up may be implemented by a tact switch which causes a change in capacitance based on a pressing state of a touch pad in which there is an air gap.

The scanning may include simultaneously scanning the at least one function touch button and the at least one comparison touch button.

The determining of whether the expected touch input corresponds to an intention of the user or to the first environmental change may include, when each capacitance value generated by the at least one function touch button is greater than a mean capacitance value of each capacitance value generated by the at least one function touch button, determining that the expected touch input corresponds to an intention of the user.

The determining of whether the expected touch input corresponds to an intention of the user or to the first environmental change may further include, when each capacitance value generated by the at least one function touch button is less than or equal to the mean capacitance value of each capacitance value generated by the at least one function touch button, determining that the expected touch input corresponds to the first environmental change.

The determining of whether the expected touch input is the determined touch input corresponding to the intention of the user or the touch input corresponding to the second environmental change may include, when a capacitance value generated by the at least one comparison touch button is greater than each mean deviation of capacitances generated by the at least one function touch button in which the expected touch input occurs, determining that the expected touch input is the determined touch input corresponding to the intention of the user.

The determining of whether the expected touch input is the determined touch input corresponding to the intention of the user or the touch input corresponding to the second environmental change further may include, when the capacitance value generated by the at least one comparison touch button is less than or equal to each mean deviation of the capacitances generated by the at least one function touch button in which the expected touch input occurs, determining that the expected touch input is the touch input corresponding to the second environmental change.

The method may further include, when the expected touch input corresponds to the first environmental change or the second environmental change, operating the touch input device in a sleep mode.

The operating in the sleep mode may include, when each capacitance value generated by the at least one comparison touch button or the at least one function touch button is less than a threshold preset or when a relative deviation of an amount of variation in all capacitances generated by the at least one comparison touch button or the at least one function touch button is within a specific range, updating the capacitance value to a current capacitance value during a predetermined time without entering the touch input device into a sleep control mode, and entering the touch input device into the sleep control mode.

Furthermore, according to embodiments of the present disclosure, a touch input device may include: at least one function touch button disposed above a printed circuit board (PCB), at least one touch electrode disposed between the PCB and the at least one function touch button, the at least one touch electrode corresponding to the at least one function touch button, a tact switch disposed between the at least one touch electrode, the tact switch configured to detect a change in capacitance by bottom compression of at least one air gap disposed between the at least one touch electrode and the at least one function touch button and to generate a wake-up signal, at least one comparison touch button spaced apart from the at least one function touch button, and a microcontroller unit (MCU) disposed in the PCB, the MCU configured to compare a capacitance generated by the at least one function touch button with a capacitance generated by the at least one comparison touch button and to determine whether a touch input corresponds to an intention of a user or to an environmental change based on the comparison of the capacitance generated by the at least one function touch button with the capacitance generated by the at least one comparison touch button.

The touch input device may further include a plurality of adhesives, each of which is disposed adjacent to the at least one touch electrode, a touch pad disposed on the plurality of adhesives, a sheet member disposed on at least one of the plurality of adhesives disposed under the touch pad and on the at least one touch electrode, and a molding resin disposed at a portion of a side of the PCB and covering a lower portion of the PCB.

The tact switch may be disposed on the PCB and disposed in the plurality of adhesives disposed adjacent to the at least one touch electrode. The at least one function touch button may correspond one-to-one to the at least one touch electrode and may be disposed in the touch pad.

When the sheet member is compressed by the bottom compression of the air gap, the tact switch may generate the wake-up signal.

Furthermore, according to embodiments of the present disclosure, a touch input device may include: a wake-up detector configured to detect a wake-up signal generated by an operation of a tact switch, a first comparison and determination device configured to determine that a touch input corresponds to an intention of a user when each capacitance value generated by at least one function touch button is greater than a mean capacitance value of each capacitance value generated by the at least one function touch button according to the detected wake-up signal, and a second comparison and determination device configured to determine that the touch input corresponds to the intention of the user when a capacitance value generated by a comparison touch button is greater than each mean deviation of capacitances generated by the at least one function touch button in which the touch input determined as corresponding to the intention of the user occurs.

The wake-up signal may be generated based on a change in capacitance generated according to a pressing state of an air gap.

When each of the capacitance values generated by the at least one function touch button is less than or equal to the mean capacitance value of the capacitance values generated by the at least one function touch button, the first comparison and determination device may determine that the touch input corresponds to a first environmental change.

When the capacitance value generated by the comparison touch button is less than or equal to each mean deviation of the capacitances generated by the at least one function touch button in which the touch input determined as corresponding to the intention of the user occurs, the second comparison and determination device may determine that the touch input corresponds to a second environmental change.

The touch input device may further include a sleep mode device configured to enter a sleep control mode when the touch input is determined as corresponding to a first touch input or a second touch input.

When each capacitance value generated by the comparison touch button or the at least one function touch button is less than a threshold preset or when a relative deviation of an amount of variation in all capacitances generated by the comparison touch button or the at least one function touch button is within a specific range, the sleep mode device may update the capacitance value to a current capacitance value during a predetermined time without entering the sleep control mode and may enter the sleep control mode.

BRIEF DESCRIPTION OF THE DRAWINGS

The above and other objects, features and advantages of the present disclosure will be more apparent from the following detailed description taken in conjunction with the accompanying drawings.

Figure 1:
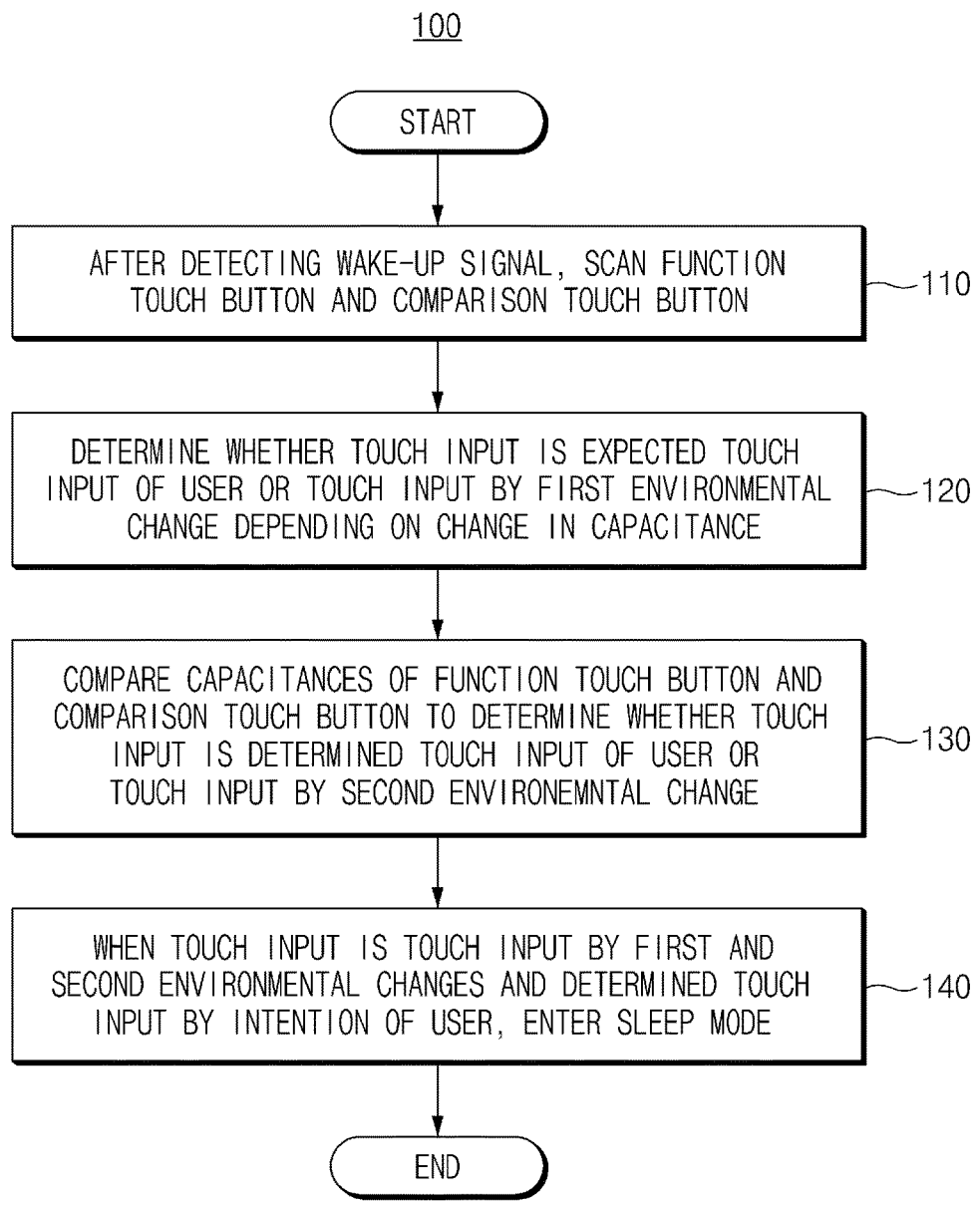
FIGS. 1 and 2 are flowcharts illustrating an example of a method for detecting a touch input according to embodiments of the present disclosure.

It should be understood that the above-referenced drawings are not necessarily to scale, presenting a somewhat simplified representation of various preferred features illustrative of the basic principles of the disclosure. The specific design features of the present disclosure, including, for example, specific dimensions, orientations, locations, and shapes, will be determined in part by the particular intended application and use environment.

DETAILED DESCRIPTION OF THE EMBODIMENTS

Since the embodiments described below are provided merely as a structural and functional description, the scope of the prevent disclosure should not be interpreted as being limited by embodiments described in the specification. In other words, since various modifications are possible in these embodiments and the embodiments is able to have various forms, the scope of the prevent disclosure should be understood as including equivalents capable of realizing the technical scope. Further, objects or effects proposed in the present disclosure do not mean that a specific embodiment should include all the objects or effects or should include only the effects, and thus the scope of the present disclosure should not be understood as being limited thereby.

Meanwhile, terms disclosed in embodiments and claims hereafter are used to describe a specific example, but the embodiments and the claims are not limited thereby.

For example, the expression of "and/or" disclosed in embodiments and claims hereafter should be understood as including any and all possible combinations of one or more of related items arrayed together.

Further, unless explicitly described to the contrary, the term "comprise", "disposed (or located or positioned)", or "have" disclosed in embodiments and claims hereafter should be understood to imply the inclusion of corresponding elements but not the exclusion of any other elements to further include other element(s).

Further, the singular expression "the" may be understood as including plural expressions as well, unless the context clearly indicates otherwise.

Further, the terms such as "1st", "2nd", "first", or "second", and the like disclosed in embodiments and claims hereafter may be used to distinguish one element from another element, but the scope of the present disclosure is not limited by such terms. For example, a first element may be named a second element. Likewise, a second element may be named a first element.

Further, it will be understood that when an element disclosed in the description of embodiments and claims hereafter is referred to as being coupled with/to" or "connected to" another element, it can be directly coupled with/to or connected to the other element or an intervening element may be present. In contrast, when an element is referred to as being "directly coupled with/to" or "directly connected to" another element, it should be understood that there are no intervening element. The same principle applies to other expressions, such as "between ~" and "just between ~" or "adjacent to ~" and "adjacent just to ~", which describe a relation between elements.

Further, a touch input device disclosed the description of embodiments and claims hereafter is useful for, but is not limited to, a user touch input interface necessary to control an electronic device (i.e., control device) for vehicle. It is defined in advance that the touch input device is applicable to a touch input device of each of various electronic devices.

For example, there may be a capacitive touch input interface optimized for a user interface of a smartphone.

A capacitive touch disclosed in the description of embodiments and claims hereafter may refer to a self-capacitance touch.

Based on this, a description will be given in detail of a method for detecting a touch input and a touch input device therefor in embodiments hereafter.

Embodiments of Detecting a Touch Input

Figure 2:
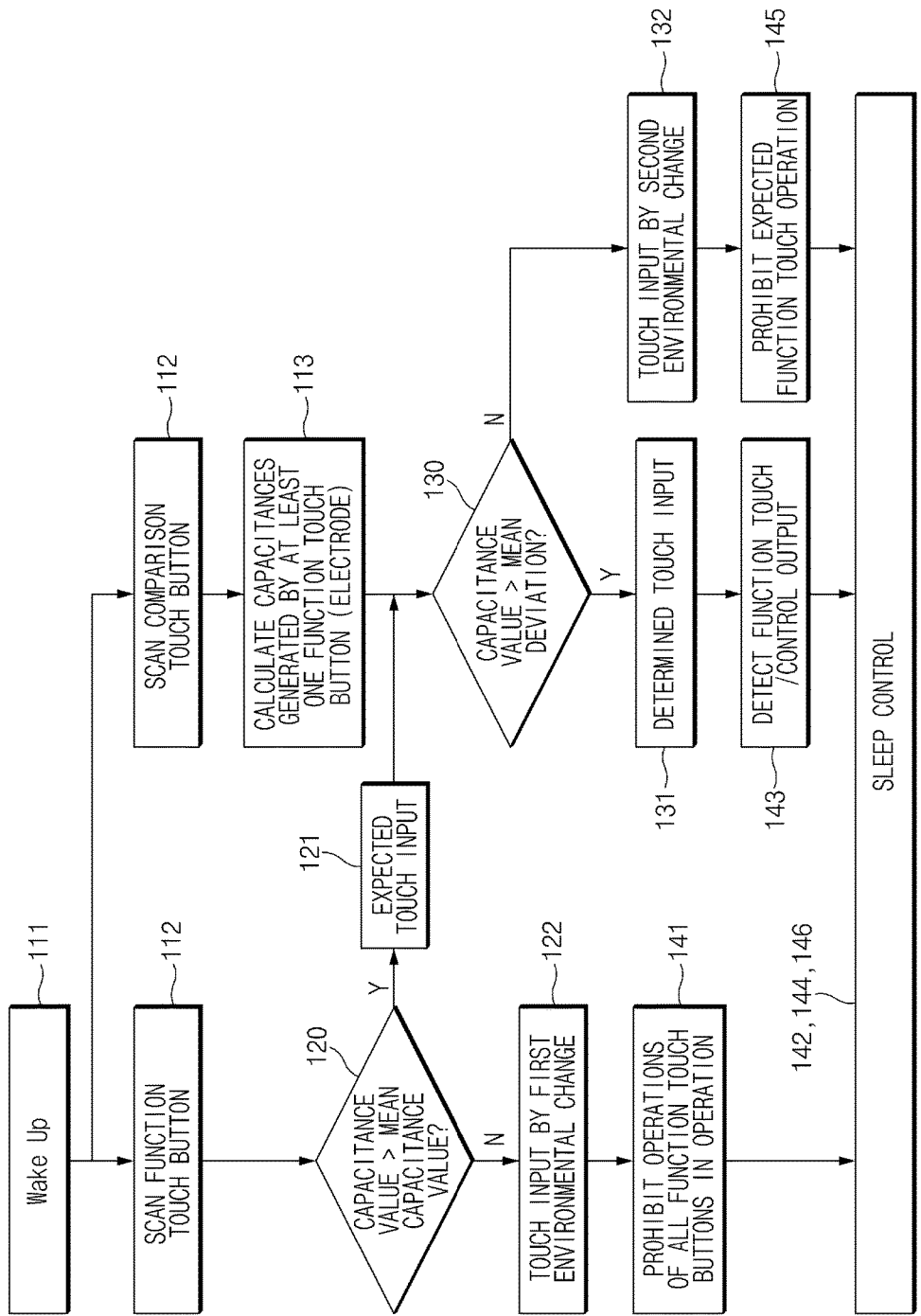
Figure 3:
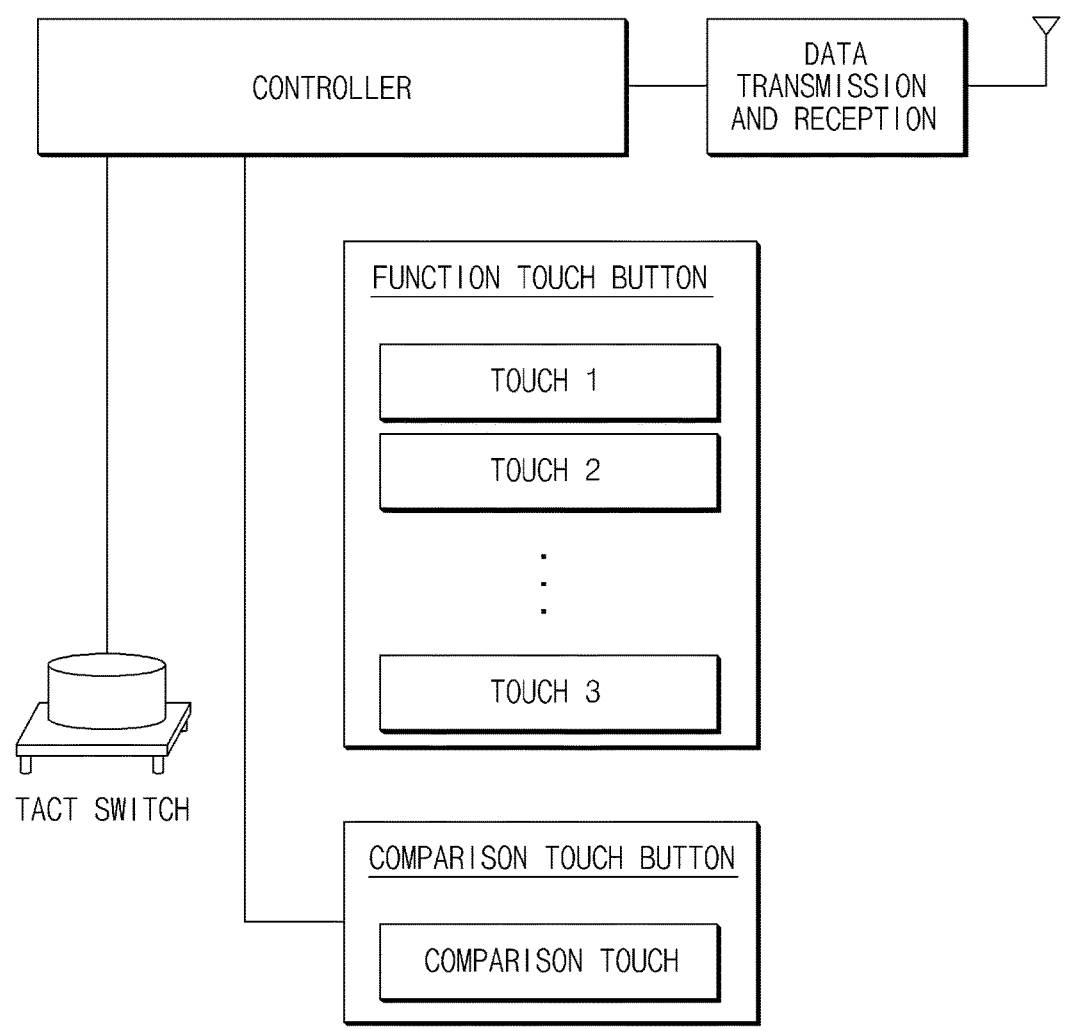
FIG. 3 is a drawing illustrating an example of a touch input device for implementing a method for detecting a touch input in FIGS. 1 and 2 according to embodiments of the present disclosure.

FIGS. 1 and 2 are flowcharts illustrating an example of a method for detecting a touch input according to embodiments of the present disclosure. FIG. 3 is a drawing illustrating an example of a touch input device for implementing a method for detecting a touch input in FIGS. 1 and 2 according to embodiments of the present disclosure.

When describing FIGS. 1 and 2, FIG. 3 will be subsidiarily cited.

Referring to FIGS. 1 and 2, a touch input method 100 according to embodiments of the present disclosure may include operations 110 to 140 for detecting a touch input at a touch input device.

As shown in FIG. 3, the touch input device which performs operations 110 to 140 may include at least one function touch button (e.g., touch 1, touch 2, touch 3, and the like), at least one comparison touch button (e.g., a comparison touch and the like), a tact switch, and a controller for detecting a wake-up signal generated by the tact switch, detecting a capacitance generated by each of the at least one function touch button and the at least one comparison touch button, and substantially implementing operations 110 to 140.

Herein, the at least one function touch button may be at least one capacitive touch input button necessary to control or operate several functions of an electronic device and may have at least one function touch electrode which substantially corresponds one-to-one to the at least one function touch button.

The at least one function touch button may include, for example, a touch input button associated with a function of performing a vehicle door lock or unlock operation depending on an operation of a smart key of a control device for a vehicle, a touch input button necessary to operate a vehicle control device which opens and closes a trunk, and a touch input button for sounding a horn.

On the other hand, the at least one comparison touch button may be distinguished from the above-mentioned at least one function touch button which performs a specific function and may include, for example, a hidden button used according to an operation of the controller without being displayed on a touch surface. Thus, the at least one comparison touch button may fail to respond to a touch input of a user.

The at least one comparison touch button may be disposed at a position where there is no indication on its surface to be seen to the user, which is not easily pressed by a user's fingers in a state where the user ergonomically holds the touch input device with his or her hand.

In embodiments of the present disclosure, the tact switch may play a role in generating a wake-up signal in response to mechanical pressing. In this case, the mechanical pressing may include pressing by a touch input of the user, environmental pressing, or the like.

Furthermore, the controller may include at least one universal processor or a microprocessor for analyzing and executing a set of instructions associated with operations 110 to 140. Further, the touch input device may further include a memory for storing an instruction to be executed by the processor and information. The memory may be implemented with a static storage device, such as a random access memory (RAM), a read only memory (ROM), or a magnetic or optical disc, or any other type of a computer-readable medium.

A description will be given of operations 110 to 140 substantially implemented by the controller of the touch input device.

First, in operation 110, the controller of the touch input device may detect a wake-up signal from the tact switch in operation 111 and may scan the at least one function touch button and the at least one comparison touch button in operation 112. The controller of the touch input device may calculate the capacitances generated by the at least one function touch button (electrode) 113.

Herein, the wake-up signal may be generated by the tact switch which causes a change in capacitance (potential difference) depending on a mechanical pressing state of a touch pad in which there is an air gap in a power-saving mode.

Thus, it is preferable for the controller of the touch input device to detect a wake-up signal in the power-saving mode and simultaneously scan at least one function touch button (electrode) and at least one comparison touch button (electrode) in response to the wake-up signal. The power-saving mode may occur when there is no touch input and may refer to a function of reducing battery consumption.

In operation 120, the controller of the touch input device may determine whether a touch input is an expected touch input corresponding to an intention of the user or to a first environmental change depending on a change in capacitance generated by the at least one scanned function touch button.

Operation 120 may include comparing a mean value parameter of capacitances generated by at least one function touch button scanned at a time period with a current value parameter of each of the capacitances generated by the at least one function touch button scanned at the time period.

For example, in operation 120, when each of capacitance values generated by the at least one function touch button scanned in operation 110 is greater than a mean capacitance value of the capacitance values generated by the at least one function touch button scanned in operation 110, the controller of the touch input device may determine the touch input as at least one touch input corresponding to an intention of the user in operation 121.

In this case, there may be a plurality of touch inputs corresponding to the intention of the user. For example, when the user simultaneously presses a function touch button 'A' and a function touch button 'B', the two touch inputs may be expected to be generated by the intention of the user.

On the other hand, when each of the capacitance values generated by the at least one function touch button scanned in operation 110 is less than or equal to the mean capacitance value of the capacitance values generated by the at least one function touch button scanned in operation 110 in operation 120, in operation 122, the controller of the touch input device may recognize the touch input as a touch input corresponding to a first environmental change rather than the touch input generated by the intention of the user. Herein, elements of the first environmental change may include temperature, humidity, liquid, and the like. As described above, the controller of the touch input device may detect a change in capacitance generated when any function touch button is pressed due to the elements of the first environmental change and may determine the touch input as the touch operation by the first environmental change.

Meanwhile, each of the capacitance values generated by the above-mentioned at least one function touch button and the mean capacitance value of the capacitance values generated by the at least one function touch button may exist as a plurality of values generated during a time period.

When the touch input is determined as the at least one touch input by the intention of the user in operation 120, in operation 130, the controller of the touch input device may compare a change in capacitance generated by the at least one scanned function touch button with a capacitance generated by the at least one scanned comparison touch button to determine whether the touch input is a determined touch input corresponding to an intention of the user or a touch input corresponding to a second environmental change.

For example, as described above, when a capacitance value generated by the at least one comparison touch button scanned in operation 110 is greater than each mean deviation of capacitances generated by the at least function touch button where a touch input determined as the touch input corresponding to the intention of the user occurs, in operation 131, the controller of the touch input device may determine the touch input as the touch input generated by the intention of the user.

The mean deviation may be a delta value ΔT and may refer to a difference between previous capacitance values and current capacitance values, generated by at least one function touch button during a time period. A capacitance value generated by the comparison touch button may be a value generated during a time interval.

Further, when the capacitance value generated in the at least one comparison touch button scanned in operation 110 is less than or equal to each mean deviation of the capacitances generated by the at least one function touch button in which the touch input determined as the touch input corresponding to the intention of the user occurs in operation 130, in operation 132, the controller of the touch input device may determine the touch input as an input operation corresponding to a second environmental change.

As such, a touch input may be distinguished according to more accurate intention of the user by comparing a change in capacitance once more using the comparison touch electrode.

Finally, in operation 140, when the touch input is the touch input by the above-mentioned first environmental change, when the touch input is the determined touch input generated by the intention of the user, and when the touch input is the touch input generated by the second environmental change, the controller of the touch input device may operate the touch input device in a sleep mode.

For example, in operation 140, when the touch input is determined as the touch input generated by the first environmental change in operation 120, the controller of the touch input device may prohibit operations of all function touch buttons in operation 141. When the operations of all the function touch buttons are prohibited, in operation 142, the controller of the touch input device may perform sleep control, for example, enter a power-saving mode.

Further, for example, when the touch input is determined as the touch input by the intention of the user in operation 130, in operation 143, the controller of the touch input device may detect a function touch of the function touch button or/and control an output. In operation 144, the controller of the touch input device may perform the sleep control, for example, enter the power-saving mode.

Further, for example, when the touch input is determined as the touch input generated by the second environmental change in operation 132, in operation 145, the controller of the touch input device may prohibit an operation of the function touch button. In operation 146, the controller of the touch input device may immediately perform the sleep control, for example, enter the power-saving mode.

However, in the following case, the controller of the touch input device may fail to immediately enter a sleep mode. In other words, when each capacitance value generated by the above-mentioned comparison touch button or the above-mentioned function touch button is less than a threshold preset in each touch button (i.e., the comparison touch button or the function touch button) or when a relative deviation of an amount of variation in all capacitances generated by the above-mentioned comparison touch button or the above-mentioned function touch button is within a predetermined range, in operation 140, the controller of the touch input device may update the capacitance value to a current capacitance value during a predetermined time without immediately entering the above-mentioned sleep control mode and may enter the sleep control mode.

Embodiments of a Touch Input Device

Figure 4:
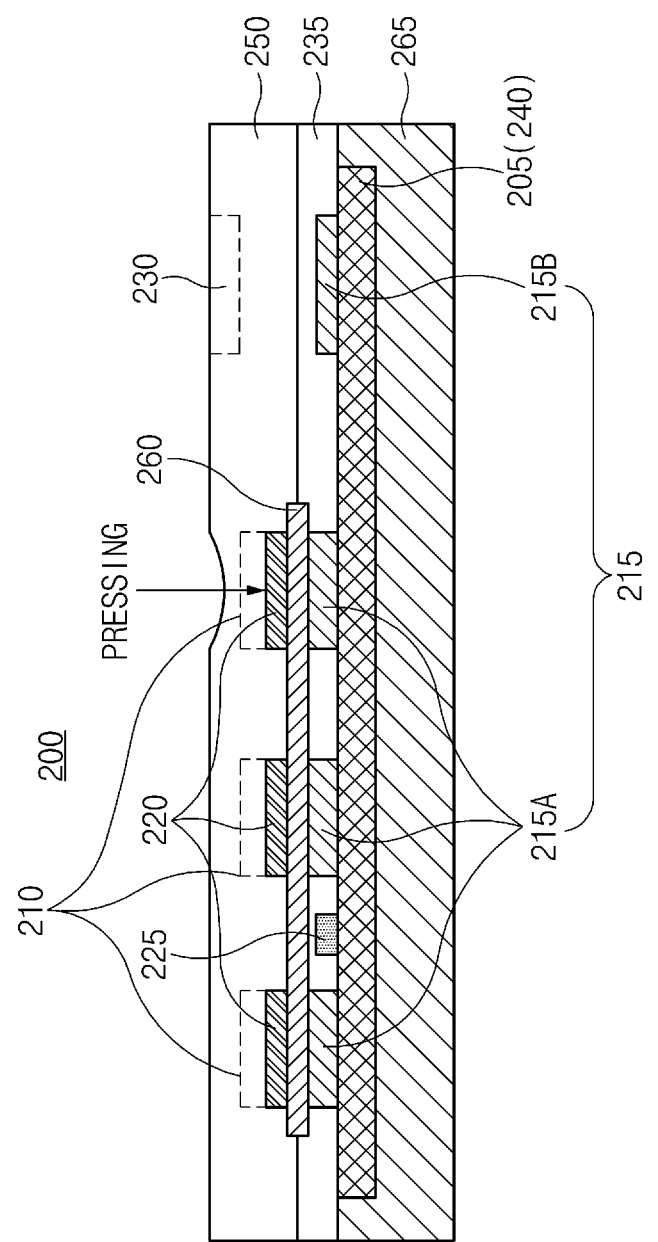
FIG. 4 is a drawing illustrating an example of a touch input device according to embodiments of the present disclosure.

FIG. 4 is a drawing illustrating an example of a touch input device according to embodiments of the present disclosure.

As shown in FIG. 4, a touch input device 200 according to an embodiment may include a printed circuit board (PCB) 205 including a microcontroller unit (MCU) 240, at least one function touch button 210, at least one touch electrode 215, at least one air gap 220, a tact switch 225, and at least one comparison touch button 230.

In embodiments of the present disclosure, the at least one function touch button 210 may be disposed above the PCB 205 and may be at least one capacitive touch input button necessary to control or operate several functions of an electronic device. For example, the at least one function touch button 210 may include a touch input button associated with a function of performing door lock or unlock depending on an operation of a smart key of a control device for vehicle, a touch input button necessary to operate a vehicle control device which opens and closes a trunk, and a touch input button which is involved in sounding a horn.

Such elements are only one example. It may be apparent that the touch input device 200 has various function touch buttons depending on a form of a corresponding input device and a supported characteristic of the electronic device.

In embodiments of the present disclosure, the at least one touch electrode 215 may be spaced apart at a predetermined distance between the PCB 205 and the at least one function touch button 210 and may be disposed to correspond one-to-one to the at least one function touch button 210 and the at least one comparison touch button 230.

Such at least one touch electrode 215 may include at least one function touch electrode 215A corresponding to the at least one function touch button 210 and at least one comparison touch electrode 215B corresponding to the at least one comparison touch button 230.

For example, the at least one air gap 220 may be disposed between the at least one touch electrode 215 and the at least one function touch button 210 and may be disposed on a plurality of sheet members to be described thereafter.

The tact switch 225 may be disposed between the at least one touch electrode 215 to perform a function of detecting a change in capacitance (potential difference) by bottom compression of the at least one air gap 220 and generating a wake-up signal.

Herein, the bottom compression of the at least one air gap 220 may refer to a mechanical pressing phenomenon. Mechanical pressing may include pressing by a touch input of a user, environmental pressing, or the like.

In embodiments of the present disclosure, the at least one comparison touch button 230 may be disposed in a touch pad 250 to be described thereafter. The at least one comparison touch button 230 may be spaced apart from the at least one function touch button 210 and may correspond one-to-one to the above-mentioned comparison touch electrode 215B.

Such at least one comparison touch button 230 may be distinguished from the above-mentioned at least one function touch button 210 which performs a specific function and may fail to be indicated on its touch surface. The at least one comparison touch button 230 may refer to a hidden button used depending on an operation of a controller. Thus, the at least one comparison touch button 230 may fail to respond to a touch of the user.

In addition, the at least one comparison touch button 230 may be disposed in a place, where there is no indication on its surface to be seen to the user, which is not easily pressed by the user's fingers in a state where the user ergonomically holds the touch input device 200 with his or her hand.

Particularly, the PCB 205 which is generally well known may have the MCU 240. When a wake-up signal is generated by the tact switch 225, the MCU 240 may compare a capacitance generated by the at least one function touch button 210 with a capacitance generated by the at least one comparison touch button 230 to determine whether a touch input is a touch input by intention of the user or a touch input by an environmental change.

The comparing of the capacitances may refer to comparing the capacitances during a time period.

Such an MCU 240 may substantially perform operations 110 to 140 described with reference to FIGS. 1 and 2. Thus, the description will be omitted.

Meanwhile, the touch input device 200 according to embodiments of the present disclosure may further include a plurality of adhesives 235, the touch pad 250, the sheet member 260, and a molding resin 265.

In embodiments of the present disclosure, the plurality of adhesives 235 may cover the above-mentioned at least one touch electrode 215 and may be disposed on the PCB 205. Alternatively, the plurality of adhesives 235 may be disposed on the PCB 205, and each of the plurality of adhesives 235 may be disposed between the at least one touch electrode 215.

Also, the touch pad 250 may cover the above-mentioned air gap 220 and may be disposed on the above-mentioned plurality of adhesives 235. The touch pad 250 may further cover the sheet member 260 to be described thereafter and may contain the comparison touch button 230.

The sheet member 260 may be arranged to come into direct contact with an upper portion of the above-mentioned tact switch 225 concurrently with being arranged to come into contact with an upper portion of the above-mentioned at least one touch electrode 215 and the at least one air gap 220.

Thus, when a lower portion of the at least one air gap 220 is contracted by mechanical pressing, this force may be supplied to the sheet member 260 to cause bottom compression. The bottom compression of such a sheet member 260 may undergo an increase in capacitance and may lead the tact switch 225 to generate a wake-up signal due to the increase in capacitance.

For example, since a conventional touch button in the form of directly attaching a symbol sheet paper to a function touch electrode surface has a small deviation between a capacitance generated when coming into contact with a hand, foreign substances, or the like and capacitances generated by the other environmental influences, intention of a user may fail to be distinguished. However, when using lower contraction (bending) of the sheet member 260, a difference between an increase in capacitance and a decrease in capacitance may be distinguished.

Finally, the molding resin 265 according to an embodiment may cover a lower portion of the above-mentioned PCB 205 and may be disposed on both sides of the PCB 205. Such a molding resin 265 may be generally well known.

As such, this embodiment may determine an accurate wake-up state by generating a wake-up signal at the tact switch and may determine whether a touch input is a touch input by accurate intention of the user or a touch input by an environmental factor through a capacitance comparison between a comparison touch button and a function touch button, thus more accurately detecting a touch input.

Additional Embodiments of a Touch Input Device

Figure 5:
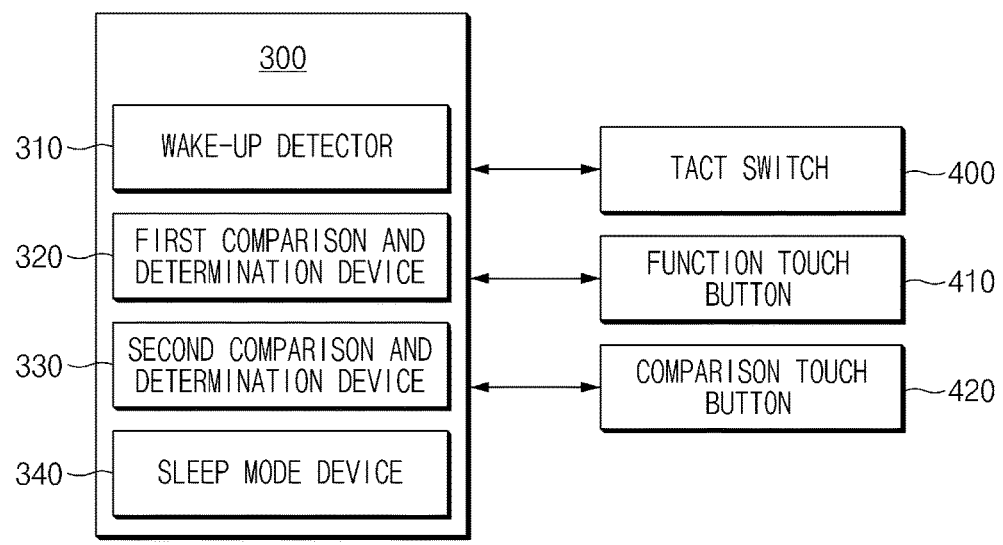
FIG. 5 is a block diagram illustrating another example of a touch input device according to embodiments of the present disclosure.

FIG. 5 is a block diagram illustrating an additional example of a touch input device according to embodiments of the present disclosure.

As shown in FIG. 5, a touch input device 300 according to embodiments of the present disclosure may include a wake-up detector 310, a first comparison and determination device 320, a second comparison and determination device 330, and a sleep mode device 340, which check a wake-up signal and a change in capacitance, generated by a tact switch 400, at least one function touch button 410, and at least one comparison touch button 420.

Herein, the at least one function touch button 410 and the at least one comparison touch button 420 may include touch electrodes respectively corresponding thereto. Thus, a change in capacitance may be substantially checked through each touch electrode.

In embodiments of the present disclosure, the wake-up detector 310 may detect a wake-up signal generated by an operation of the tact switch 400. The wake-up signal may be generated by a change in capacitance (potential difference).

For example, the wake-up signal may be a signal by a change in capacitance generated depending on a pressing state of an air gap (not shown). The change in capacitance may be generated by bottom compression of at least one air gap (not shown) disposed between at least one touch electrode (not shown). The bottom compression of the at least one air gap may refer to a mechanical pressing phenomenon. Mechanical pressing may include pressing by a touch input of a user, environmental pressing, or the like.

In embodiments of the present disclosure, when each of capacitance values generated by the at least one function touch button 410 is greater than an mean capacitance value of the capacitance values generated by the at least one function touch button 410 depending on the wake-up signal detected by the wake-up detector 310, the first comparison and determination device 320 may determine a touch input as at least one touch input corresponding to an intention of the user.

In this case, for example, when there are 5 function touch buttons, the at least one determined touch input by the intention of the user may be recognized as a touch input by the intention of the user at 2 any function touch buttons.

Meanwhile, the mean capacitance value described herein may refer to a value obtained by averaging current capacitance values generated by the at least one function touch button 410. Such a mean capacitance value may be generated as a plurality of capacitance values over a time period or under time control.

However, when each of the capacitance values generated by the at least one function touch button 410 is less than or equal to the mean capacitance value of the capacitance values generated by the at least one scanned function touch button 410, the first comparison and determination device 320 may determine the touch input as a touch input corresponding to a first environmental change.

Herein, the determining of the touch input as the touch input corresponding to the first environmental change may refer to determining that a change in capacitance generated by the any function touch button 410 is generated due to an environmental cause (e.g., temperature, humidity, liquid, or the like) rather than a touch input by intention of the user.

In embodiments of the present disclosure, when a capacitance value generated by the comparison touch button 420 is greater than each mean deviation of capacitances generated by the at least one function touch button 410 where the touch input determined as the above-mentioned touch input occurs, the second comparison and determination device 330 may determine the touch input as a touch input corresponding to the intention of the user.

For example, when the above-mentioned first comparison and determination device 320 determines that there is at least one touch input corresponding to the intention of the user, the second comparison and determination device 330 may perform an operation of detecting a touch input of the user, which is clearly indicated among touch inputs by the intention of the user, which are determined through comparison with a change in capacitance generated by the comparison touch button 420.

Herein, the mean deviation described herein may be a delta value $\Delta T$ and may refer to a difference between previous capacitance values and current capacitance values, generated by at least one function touch button at a time period, and may have a plurality of values. A capacitance value generated by the comparison touch button 420 may be a plurality of values generated at a time interval.

However, when the capacitance value generated by the comparison touch button 420 is less than or equal to each mean deviation of the capacitances generated by the at least one function touch button 410 where the touch input determined as the touch input by the intention of the user occurs, the second comparison and determination device 330 may determine the touch input as a touch input corresponding to a second environmental change.

Herein, the determining of the touch input as the touch input corresponding to the second environmental change may refer to determining that a change in capacitance generated by the any function touch button 410 is generated by an environmental cause (e.g., temperature, humidity, liquid, or the like) rather than a touch input by intention of the user.

As such, a wake-up state may be accurately determined by detecting a wake-up signal generated by the tact switch and may determine whether a touch input is a touch input corresponding to an intention of the user or to an environmental factor through a capacitance comparison between a comparison touch button and a function touch button.

Finally, the sleep mode device 340 according to embodiments of the present disclosure may enter a sleep control mode in response to the determination of the above-mentioned touch inputs by the first and second environmental changes and the determination of the touch input by the intention of the user. In this case, the sleep control mode may be, for example, a power-saving mode and may be an operation mode for reducing battery consumption.

However, in the following case, the sleep mode device 340 may fail to immediately enter the sleep control mode. In other words, when each capacitance value generated by the above-mentioned comparison touch button 420 or the above-mentioned function touch button 410 is less than a threshold preset in each touch button (i.e., the comparison touch button 420 or the function touch button 420) or when a relative deviation of an amount of variation in all capacitances generated by the comparison touch button 420 or the function touch button 410 is within a predetermined range, the sleep mode device 340 may update the capacitance value to a current capacitance value during a predetermined time without immediately entering the above-mentioned sleep control mode and may enter the sleep control mode.

Embodiments of a Touch Interface

Figure 6:
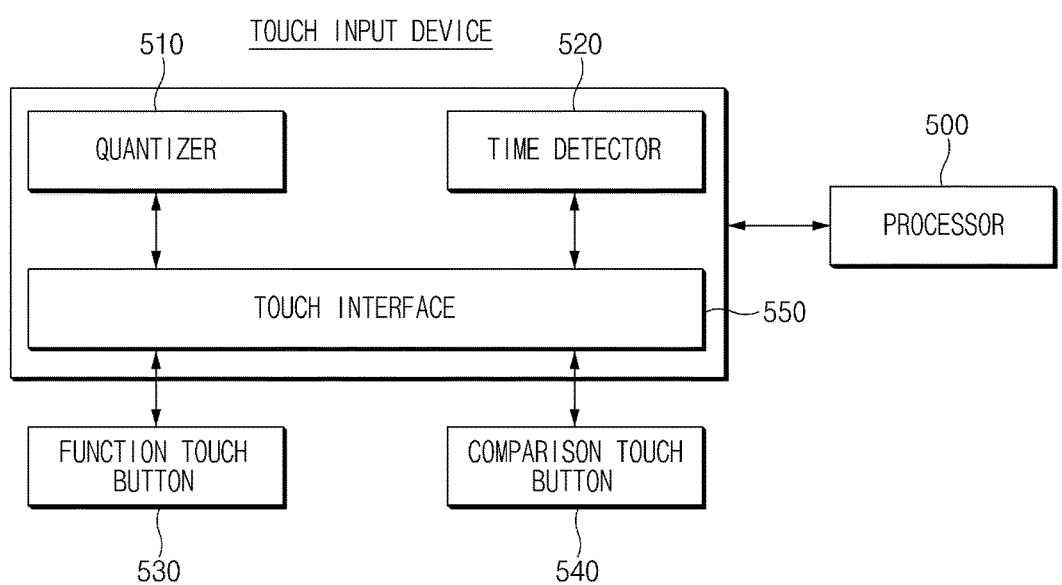
FIG. 6 is a block diagram illustrating an electrical touch control configuration of a touch input device according to embodiments of the present disclosure.

FIG. 6 is a block diagram illustrating an electrical touch control configuration of a touch input device according to embodiments of the present disclosure.

As shown in FIG. 6, a touch input device according to an embodiment may include a processor 500 (e.g., an MCU), a quantizer 510, a time detector 520, at least one function touch button 530, at least one comparison touch button 540, and a touch interface 550.

In an embodiment, when respective touch buttons are waked up every time irrespective of detection of the respective touch buttons, the processor 500 (e.g., the MCU) may detect a change in capacitance generated by the at least one function touch button 530 and the at least one comparison touch button 540. Further, the processor 500 may detect a change in capacitance generated by the at least one function touch button 530 and the at least one comparison touch button 540 over a time period or any time provided from the time detector 520 through control of the time detector 520.

However, the detecting of the change in capacitance may be performed through touch electrodes formed to respectively correspond to the at least one function touch button 530 and the at least one comparison touch button 540.

Thus, it should be understood that the at least one function touch button 530 and the at least one comparison touch button 540 implicitly include touch electrodes respectively corresponding thereto. This is generally well known. Since the above-mentioned detecting of the change in capacitance is described above, the description will be omitted.

In embodiments of the present disclosure, the time detector 520 may have a function of controlling a physical time for detecting capacitances of the at least one function touch button 530 and/or the at least one comparison touch button 540.

Such a time detector 520 may control a time used to detect capacitances generated by each or all of the at least one function touch button 530 and a time used to detect capacitances generated by the at least one comparison touch button 540, from a wake-up time.

The processor 500 (e.g., the MCU) may further control the quantizer 510 and the touch interface 550 as well as electric control of the time detector 520, the at least one function touch button 530, and the at least one comparison touch button 540.

In embodiments of the present disclosure, the touch interface 550 may interface an electrical signal transmitted and received between the quantizer 510, the time detector 520, the at least one function touch button 530, and the at least one comparison touch button 540.

For example, the touch interface 550 may perform electrical signal interfacing of converting a changed electrical signal of capacitances generated from the at least one function touch button 530 and/or the at least one comparison touch button 540 into an analog form.

Also, the quantizer 510 may perform a function of converting an electrical capacitance measured from a surface of the at least one function touch button 530 and the at least one comparison touch button 540 (e.g., a decoration sheet paper and adhesive material capable of performing various capacitive touch inputs) into a digital value depending on control of the processor 500.

Embodiments of a Touch Surface of a Touch Input Device

Figure 7:
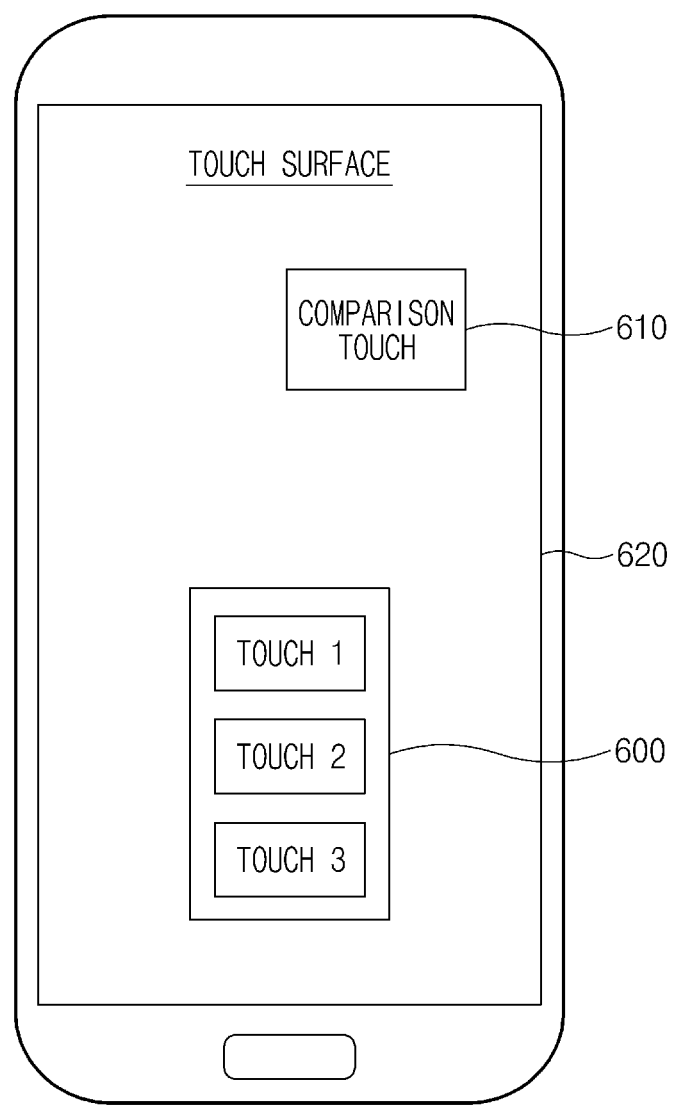
FIG. 7 is a drawing illustrating an example of a touch surface of a touch input device according to embodiments of the present disclosure.

FIG. 7 is a drawing illustrating an example of a touch surface of a touch input device according to embodiments of the present disclosure.

As shown in FIG. 7, the touch surface of the touch input device according to embodiments of the present disclosure may include at least one function touch button 600, at least one comparison touch button 610, and a tact switch (not shown).

The at least one function touch button 600 (e.g., touch 1, touch 2, touch 3, and the like) may be disposed on an approximate central point of the touch surface to be easily touched by a user, but the at least one comparison touch button 610 (e.g., a comparison touch and the like) may be disposed around a periphery of the touch surface.

Since the at least one function touch button 600 and the at least one comparison touch button 610 are arranged under a touch pad 620 (e.g., a sheet), shapes and/or blocks corresponding to the buttons 600 and 610 may be printed on the sheet to distinguish the at least one function touch button 600 and the at least one comparison touch button 610.

The tact switch (not shown) may be disposed near a lower portion of the at least one function touch button 600 to generate a wake-up signal.

As such, embodiments of the present disclosure may provide the following advantages as compared with the related art.

First, in the related art, when a capacitance is changed by intention and non-intention of the user in a power-saving mode state, the change in capacitance is not recognized at a touch time and an unintended operation occurs. However, embodiments of the present disclosure may accurately detect a change in capacitance using a comparison touch.

Second, in the related art, when a plurality of function touch buttons are pressed, a specific pattern may fail to be compared due to a phenomenon where capacitances are simultaneously increased. However, embodiments of the present disclosure may classify a specific range with a touch button pressed by the user or may detect a pattern of a capacitance range by using a comparison touch button.

Third, embodiments of the present disclosure may detect an actually pressed touch button using a difference between capacitances generated by a comparison touch button and a function touch button.

Fourth, since a potential difference (capacitance) of a tact switch generated by contraction of an air gap mechanically disposed is changed at a time when a touch function button is pressed, embodiments of the present disclosure may enhance the pressing feel of the user by mechanical pressing by the air gap.

Fifth, embodiments of the present disclosure may distinguish whether a touch input is in a touch input state by intention of the user or in a touch input state by an environmental factor by distinguishing a difference in capacitance generated by pressing a surface of a function touch button, in a situation where a material in which a capacitance is detected is in contact with the surface of the function touch button.

According to the above effects, embodiments of the present disclosure may easily distinguish whether the user input is a user input by intention of the user or an environmental change (e.g., a change due to temperature, humidity, liquid, or the like) by accurately distinguishing a change in capacitance and may ultimately increase accuracy of touch, thus enhancing satisfaction of the user.

The effect of the present disclosure is not limited to the above-mentioned effects, and other effects which are not described above may be clearly understood to those skilled in the art from the description above. As such, while the present disclosure has been described with reference to certain embodiments, it will be apparent to those skilled in the art that various changes and modifications may be made without departing from the spirit and scope of the present disclosure.

What is claimed is:

1. A method for detecting a touch input at a touch input device, the method comprising:
    after a wake-up of the touch input device, scanning at least one function touch button of the touch input device and at least one comparison touch button of the touch input device;
    detecting a change in capacitance generated by the at least one function touch button and a change in capacitance generated by the at least one comparison touch button as a result of the scanning of the at least one function touch button and the at least one comparison touch button;
    determining whether an expected touch input corresponds to an intention of a user or to a first environmental change causing the change in capacitance generated by the at least one function touch button;
    comparing the change in capacitance generated by the at least one function touch button with the change in capacitance generated by the at least one comparison touch button; and
    determining whether the expected touch input is a determined touch input corresponding to the intention of the user or a touch input corresponding to a second environmental change based on the comparison of the change in capacitance generated by the at least one function touch button with the change in capacitance generated by the at least one comparison touch button.

2. The method of claim 1, wherein the wake-up is implemented by a tact switch which causes a change in capacitance based on a pressing state of a touch pad in which there is an air gap.

3. The method of claim 1, wherein the scanning of the at least one function touch button and the at least one comparison touch button comprises:
    simultaneously scanning the at least one function touch button and the at least one comparison touch button.

4. The method of claim 1, wherein the determining of whether the expected touch input corresponds to an intention of the user or to the first environmental change comprises:
    when each capacitance value generated by the at least one function touch button is greater than a mean capacitance value of each capacitance value generated by the at least one function touch button, determining that the expected touch input corresponds to an intention of the user.

5. The method of claim 4, wherein the determining of whether the expected touch input corresponds to an intention of the user or to the first environmental change further comprises:
    when each capacitance value generated by the at least one function touch button is less than or equal to the mean capacitance value of each capacitance value generated by the at least one function touch button, determining that the expected touch input corresponds to the first environmental change.

6. The method of claim 5, further comprising:
    when the expected touch input corresponds to the first environmental change or the second environmental change, operating the touch input device in a sleep mode.

7. The method of claim 6, wherein the operating of the touch input device in the sleep mode comprises:
    when each capacitance value generated by the at least one comparison touch button or the at least one function touch button is less than a threshold preset or when a relative deviation of an amount of variation in all capacitances generated by the at least one comparison touch button or the at least one function touch button is within a specific range, updating the capacitance value to a current capacitance value during a predetermined time without entering the touch input device into a sleep control mode, and entering the touch input device into the sleep control mode.

8. The method of claim 1, wherein the determining of whether the expected touch input is the determined touch input corresponding to the intention of the user or the touch input corresponding to the second environmental change comprises:
    when a capacitance value generated by the at least one comparison touch button is greater than each mean deviation of capacitances generated by the at least one function touch button in which the expected touch input occurs, determining that the expected touch input is the determined touch input corresponding to the intention of the user.

9. The method of claim 8, wherein the determining of whether the expected touch input is the determined touch input corresponding to the intention of the user or the touch input corresponding to the second environmental change further comprises:
    when the capacitance value generated by the at least one comparison touch button is less than or equal to each mean deviation of the capacitances generated by the at least one function touch button in which the expected touch input occurs, determining that the expected touch input is the touch input corresponding to the second environmental change.

10. A touch input device, comprising:
    at least one function touch button disposed above a printed circuit board (PCB);
    at least one touch electrode disposed between the PCB and the at least one function touch button, the at least one touch electrode corresponding to the at least one function touch button;
    a tact switch disposed between the at least one touch electrode, the tact switch configured to detect a change in capacitance by bottom compression of at least one air gap disposed between the at least one touch electrode and the at least one function touch button and to generate a wake-up signal;

at least one comparison touch button spaced apart from the at least one function touch button; and a microcontroller unit (MCU) disposed in the PCB, the MCU configured to compare a capacitance generated by the at least one function touch button with a capacitance generated by the at least one comparison touch button and to determine whether a touch input corresponds to an intention of a user or to an environmental change based on the comparison of the capacitance generated by the at least one function touch button with the capacitance generated by the at least one comparison touch button.

11. The touch input device of claim 10, further comprising:

a plurality of adhesives, each of which is disposed adjacent to the at least one touch electrode;

a touch pad disposed on the plurality of adhesives;

a sheet member disposed on at least one of the plurality of adhesives disposed under the touch pad and on the at least one touch electrode; and a molding resin disposed at a portion of a side of the PCB and covering a lower portion of the PCB.

12. The touch input device of claim 11, wherein:

the tact switch is disposed on the PCB and disposed in the plurality of adhesives disposed adjacent to the at least one touch electrode, and the at least one function touch button corresponds one-to-one to the at least one touch electrode and is disposed in the touch pad.

13. The touch input device of claim 11, wherein, when the sheet member is compressed by the bottom compression of the air gap, the tact switch generates the wake-up signal.

14. A touch input device for detecting a touch input, the touch input device comprising:

a wake-up detector configured to detect a wake-up signal generated by an operation of a tact switch;

a first comparison and determination device configured to determine that a touch input corresponds to an intention of a user when each capacitance value generated by at least one function touch button is greater than a mean capacitance value of each capacitance value generated by the at least one function touch button according to the detected wake-up signal; and a second comparison and determination device configured to determine that the touch input corresponds to the intention of the user when a capacitance value generated by a comparison touch button is greater than each mean deviation of capacitances generated by the at least one function touch button in which the touch input determined as corresponding to the intention of the user occurs.

15. The touch input device of claim 14, wherein the wake-up signal is generated based on a change in capacitance generated according to a pressing state of an air gap.

16. The touch input device of claim 14, wherein, when each of the capacitance values generated by the at least one function touch button is less than or equal to the mean capacitance value of the capacitance values generated by the at least one function touch button, the first comparison and determination device determines that the touch input corresponds to a first environmental change.

17. The touch input device of claim 14, wherein, when the capacitance value generated by the comparison touch button is less than or equal to each mean deviation of the capacitances generated by the at least one function touch button in which the touch input determined as corresponding to the intention of the user occurs, the second comparison and determination device determines that the touch input corresponds to a second environmental change.

18. The touch input device of claim 14, further comprising:

a sleep mode device configured to enter a sleep control mode when the touch input is determined as corresponding to a first touch input or a second touch input.

19. The touch input device of claim 18, wherein, when each capacitance value generated by the comparison touch button or the at least one function touch button is less than a threshold preset or when a relative deviation of an amount of variation in all capacitances generated by the comparison touch button or the at least one function touch button is within a specific range, the sleep mode device updates the capacitance value to a current capacitance value during a predetermined time without entering the sleep control mode and enters the sleep control mode.

* * * * *